(12) United States Patent
Lee et al.

(10) Patent No.: US 8,998,456 B2
(45) Date of Patent: Apr. 7, 2015

(54) OPTICAL TRANSMISSION APPARATUS HAVING TEMPERATURE CONTROL FUNCTION

(75) Inventors: Jong Jin Lee, Gwangju (KR); Kwon Seob Lim, Gwangju (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 489 days.

(21) Appl. No.: 13/211,825

(22) Filed: Aug. 17, 2011

(65) Prior Publication Data
US 2012/0069574 A1 Mar. 22, 2012

(30) Foreign Application Priority Data
Sep. 20, 2010 (KR) .................. 10-2010-0092542

(51) Int. Cl.
F21V 7/20 (2006.01)
H01L 25/16 (2006.01)
H01L 33/64 (2010.01)
G02B 6/42 (2006.01)

(52) U.S. Cl.
CPC ............. *H01L 25/167* (2013.01); *H01L 33/644* (2013.01); *G02B 6/4286* (2013.01); *G02B 6/4214* (2013.01); *H01L 2224/48091* (2013.01); *H01L 2924/3011* (2013.01); *G02B 6/4271* (2013.01); *H01L 2924/30107* (2013.01)

(58) Field of Classification Search
USPC ............................ 362/296.01–297, 341, 345
See application file for complete search history.

(56) References Cited

U.S. PATENT DOCUMENTS

| | | | |
|---|---|---|---|
| 6,703,561 B1 * | 3/2004 | Rosenberg et al. | 361/714 |
| 7,092,418 B2 * | 8/2006 | Stewart et al. | 372/36 |
| 7,263,112 B2 | 8/2007 | Oomori et al. | |
| 7,856,038 B2 * | 12/2010 | Oomori | 372/36 |
| 2003/0235050 A1 * | 12/2003 | West et al. | 362/327 |
| 2004/0008937 A1 * | 1/2004 | Mahgerefteh et al. | 385/37 |
| 2005/0008049 A1 * | 1/2005 | Oomori et al. | 372/36 |
| 2006/0098697 A1 | 5/2006 | Kim et al. | |
| 2007/0237196 A1 | 10/2007 | Oomori | |
| 2009/0245297 A1 | 10/2009 | Richter | |

FOREIGN PATENT DOCUMENTS

KR 1020090042098 A 4/2009

* cited by examiner

Primary Examiner — William Carter

(57) ABSTRACT

An optical transmission apparatus having a temperature control function includes: a package having a cavity; a cooler mounted in the cavity and controlling temperature; and a substrate mounted on the cooler and including a light source mounted thereon to generate light. In spite of the presence of the cooler, the apparatus can be implemented to be compact and have a simple structure.

6 Claims, 5 Drawing Sheets

OPTICAL TRANSMISSION APPARATUS HAVING TEMPERATURE CONTROL FUNCTION

CROSS-REFERENCE TO RELATED APPLICATIONS

This application claims the priority of Korean Patent Application No. 10-2010-0092542 filed on Sep. 20, 2010, in the Korean Intellectual Property Office, the disclosure of which is incorporated herein by reference.

BACKGROUND OF THE INVENTION

1. Field of the Invention

The present invention relates to an optical transmission apparatus and, more particularly, to an optical transmission apparatus including a cooler for controlling the temperature of the optical transmission apparatus.

2. Description of the Related Art

A WDM-PON (Wavelength Division Multiplexing Passive Optical Network) technique using WDM is a communication technique capable of grouping optical signals of different wavelengths by using a single optical fiber and transmitting the same.

The WDM-PON technique has advantages in that it does not cause interference with an optical signal of a different wavelength, guarantees a broadband bi-directional symmetrical service by assigning a unique wavelength to each subscriber, and has excellent security because only a particular subscriber is allowed to receive an optical signal of a particular wavelength. The WDM technique has been commonly used in the existing backbone network and, recently, there is a move to extend the use of the SDM technique even to a subscriber network.

In case of optical communication using WDM, because it uses the method of dividing wavelength, compared with existing time division multiplexing and frequency division multiplexing, it requires a thermo-electric cooler for controlling an operational temperature of a light source to have a certain degree in order to ensure temperature stability of an optical module, namely, in order to prevent malfunctions caused by a wavelength transition according to temperature.

However, the installation of the cooler in an optical transmission apparatus increases the size of an optical transmission module, which may in turn trigger secondary problems.

For example, when a package, a cooler, a substrate, various elements (e.g., a light source, a monitoring element, a reflector, a thermister, and the like), are sequentially stacked, the distance between the package and the elements is increased due to the presence of the cooler. Then, a lead pin of the package for supplying the power of the elements, a bonding wire for connecting the package lead pin and the elements would be lengthened and the signal transmission characteristics of the optical transmission apparatus would deteriorate proportionally. In addition, a cooling load of the cooler increased according to the size of the optical transmission module.

SUMMARY OF THE INVENTION

An aspect of the present invention provides an optical transmission apparatus having a temperature control function capable of offsetting the height of a cooler by proposing a package with a cavity, to thus reduce the size of the apparatus in spite of the presence of the cooler.

Another aspect of the present invention provides an optical transmission apparatus having a temperature control function capable of having a simpler structure by eliminating a support for mounting a monitoring element thereon or a reflector for reflecting light from a light source to the outside.

According to an aspect of the present invention, there is provided an optical transmission apparatus including: a package having a cavity; a cooler mounted in the cavity and controlling temperature; and a substrate mounted on the cooler and including a light source mounted thereon to generate light.

The package may include: a base having the cavity formed therein; and lead pins penetrating the base.

The package may further include an insulator formed to cover the lead pins.

The optical transmission apparatus may further include: a reflector mounted on the cooler and totally reflecting light from the light source to the outside.

The reflector may include: a bar mirror having a sloped face formed on an area to which light is made incident; and a total reflection coated film formed on the sloped face.

The optical transmission apparatus may further include: a support mounted on the cooler; and a monitoring light reception element mounted on the support and receiving light to perform a monitoring operation.

The optical transmission apparatus may further include: a reflector mounted on the cooler such that it is positioned in front of the light source, and reflecting a majority of light from the light source to the outside and allowing the remaining portion to be transmitted therethrough.

The reflector may include: a bar mirror having a sloped face formed on an area to which light is made incident; a beam splitter coated film formed on the sloped face; and a non-reflection coated film formed on an area from which light is output.

The optical transmission apparatus may further include: a monitoring light reception element mounted on the cooler such that it is positioned in front of the light source and the reflector, and performing a monitoring operation upon receiving light made incident through the reflector.

The reflector may include: a bar mirror having a sloped face formed on an area to which light is made incident; a beam splitter coated film formed on the sloped face; a total reflection coated film formed on an area from which light is output; and a non-reflection coated film formed on an area that light, which has been reflected by the total reflection coated film, reaches.

The optical transmission apparatus may further include: a monitoring light reception element mounted on the non-reflection coated film of the reflector and performing a monitoring operation upon receiving light made incident through the reflector.

The optical transmission apparatus may further include: a support mounted on the cooler such that it is positioned in front of the light source, and having a sloped face; and a monitoring light reception element mounted on the sloped face of the support, and reflecting a majority of light from the light source to the outside and receiving the remaining portion of the light to perform a monitoring operation.

The monitoring light reception element may include a beam splitter coated film formed on an area to which light is made incident.

The light source may include a total reflection coated film to allow light from the light source to be entirely output toward the reflector.

The optical transmission apparatus may further include: a thermister mounted on the cooler or the substrate to measure the temperature of the optical transmission apparatus.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
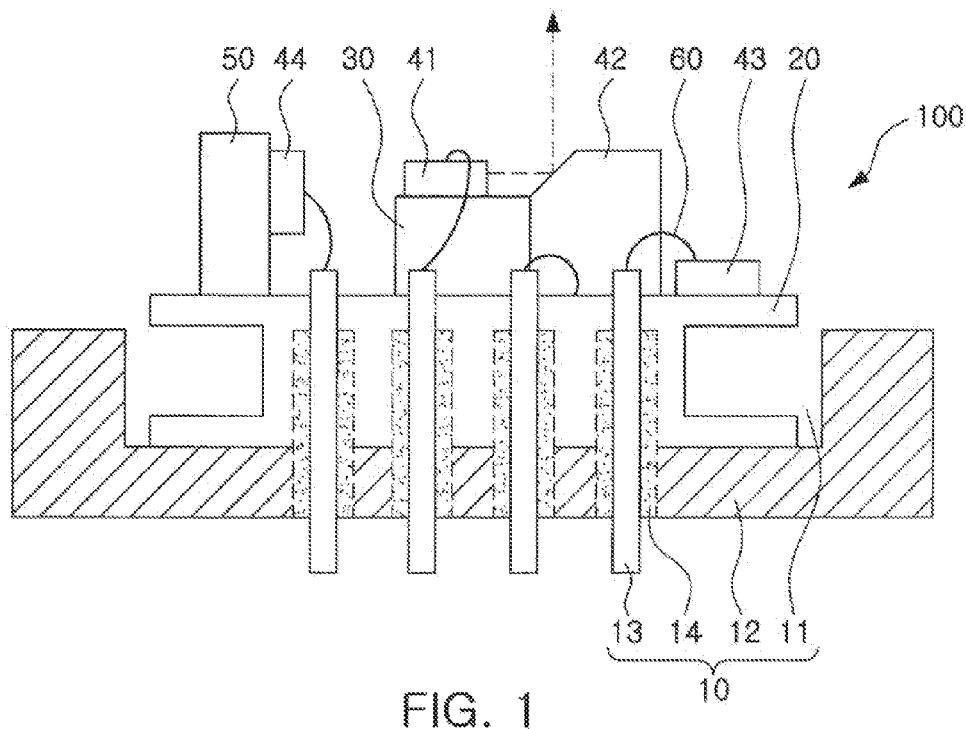
FIG. 1 is a view illustrating a light transmission apparatus according to a first exemplary embodiment of the present invention.

The present invention may be modified variably and may have various embodiments, particular examples of which will be illustrated in drawings and described in detail.

However, it should be understood that the following exemplifying description of the invention is not intended to restrict the invention to specific forms of the present invention but rather the present invention is meant to cover all modifications, similarities and alternatives which are included in the spirit and scope of the present invention.

While terms such as "first" and "second," etc., may be used to describe various components, such components must not be understood as being limited to the above terms. The above terms are used only to distinguish one component from another. For example, a first component may be referred to as a second component without departing from the scope of rights of the present invention, and likewise a second component may be referred to as a first component. The term "and/or" encompasses both combinations of the plurality of related items disclosed and any item from among the plurality of related items disclosed.

When a component is mentioned as being "connected" to or "accessing" another component, this may mean that it is directly connected to or accessing the other component, but it is to be understood that another component may exist therebetween. On the other hand, when a component is mentioned as being "directly connected" to or "directly accessing" another component, it is to be understood that there are no other components in-between.

The terms used in the present application are merely used to describe particular embodiments, and are not intended to limit the present invention. An expression used in the singular encompasses the expression of the plural, unless it has a clearly different meaning in the context in which it is used. In the present application, it is to be understood that the terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

Unless otherwise defined, all terms used herein, including technical or scientific terms, have the same meanings as those generally understood by those with ordinary knowledge in the field of art to which the present invention belongs. Such terms as those defined in a generally used dictionary are to be interpreted as having meanings equal to the contextual meanings in the relevant field of art, and are not to be interpreted as having ideal or excessively formal meanings unless clearly defined as having such in the present application.

Embodiments of the present invention will be described below in detail with reference to the accompanying drawings, where those components are rendered using the same reference number that are the same or are in correspondence, regardless of the figure number, and redundant explanations are omitted.

FIG. 1 is a view illustrating a light transmission apparatus according to a first exemplary embodiment of the present invention.

As shown in FIG. 1, a light emission apparatus 100 includes a package 10, a cooler 20 mounted in a cavity 11 to uniformly maintain the temperature of the optical transmission apparatus 100, a substrate 30 mounted on the cooler 20 and including a light source 41 for generating light, a reflector 42 mounted on the cooler 20 such that it is positioned in front of the light source 41 and reflecting light from the light source 41 to the outside (e.g., an optical fiber), a thermister 43 mounted on the cooler 20 and measuring an internal temperature of the light transmission apparatus 100, a support 50 mounted on the cooler 20 such that it is positioned behind the light source 41, and a monitoring element 44 mounted on the support 50 and receiving light from the light source 41 to monitor an operational state of the light source 41.

Figure 2:
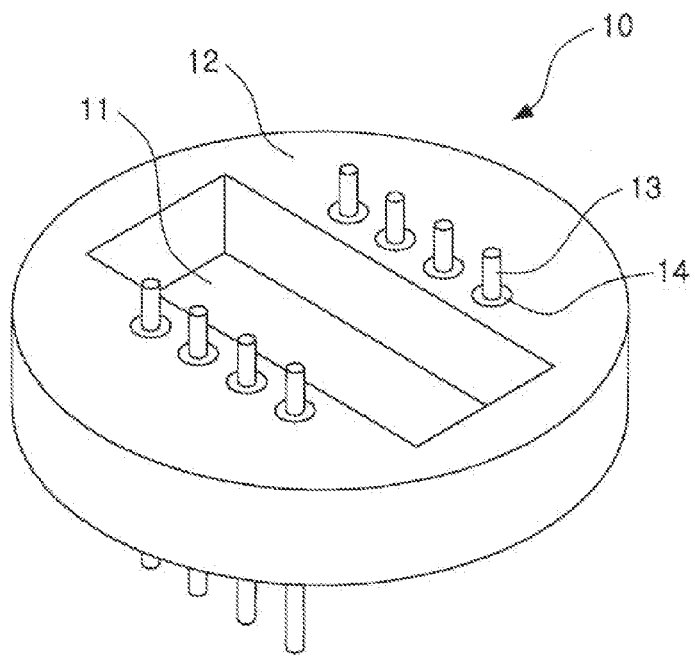
FIG. 2 is a view illustrating a package according to the first exemplary embodiment of the present invention.

FIG. 2 is a view illustrating the package according to the first exemplary embodiment of the present invention.

With reference to FIG. 2, the package 10 includes a base 12 having a cavity 11 formed at a central portion thereof, lead pins 13 penetrating an outer area of the base 12 and transmitting and receiving a signal to and from the internal elements 41 to 44 of the optical transmission apparatus 100, and insulators 14 formed to cover the respective lead pins 13 to insulate the base 12 and the lead pins 13 and performing impedance matching.

The cavity 11 can be generally fabricated through a processing method such as a milling operation, pressing, MIM (Metal Injection Molding), and the like, using a shelf, and the insulators 14 may be implemented through glass soldering, or the like.

If the cavity 11 is not formed in the base 12, the cooler 20, the substrate 30, and the internal elements 41 to 44 would be sequentially stacked on an upper surface of the base 12, increasing the distance between the base 12 and the internal elements 41 to 44 by the height of the cooler 20.

When the distance between the base 12 and the internal elements 41 to 44 increases, the length of the lead pin 13 for connecting the power of the internal elements 41 to 44 would increase. The increase in the length of the lead pins 13 would lead to an increase in noise, loss, crosstalk characteristics of a signal delivered through the lead pins 13 to degrade the overall signal characteristics of the optical transmission apparatus 100.

Thus, in an exemplary embodiment of the present invention, the cavity 11 is formed in the base 11 to offset the height of the cooler 20 to thus shorten the distance between the base 12 and the internal elements 41 to 44. Accordingly, the length of the lead pins can be shortened and the signal characteristics of the optical transmission apparatus 100 can be improved in proportion to the reduced length of the lead pins 13.

In the present exemplary embodiment, the base 12 and the insulators 14 have a coaxial structure, minimizing exposed portions of the impedance-matched lead pins 13, thus maintaining the impedance characteristics, and the overall length of signal lines 60 continued from the wire bonding to the lead pins 113 can be reduced to lower an inductance value.

Also, in the present exemplary embodiment, the outer area of the base 12 (namely, the peripheral area of the cavity 11) is increased to reduce heat resistance through heat sinking, thus increasing a heat release effect of the cooler 20.

Figure 3A:
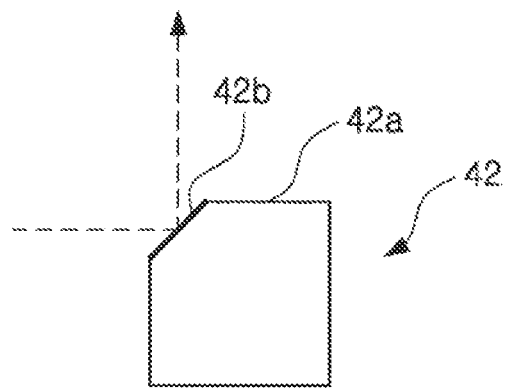
FIG. 3A is a view illustrating a reflector according to the first exemplary embodiment of the present invention.
Figure 3B:
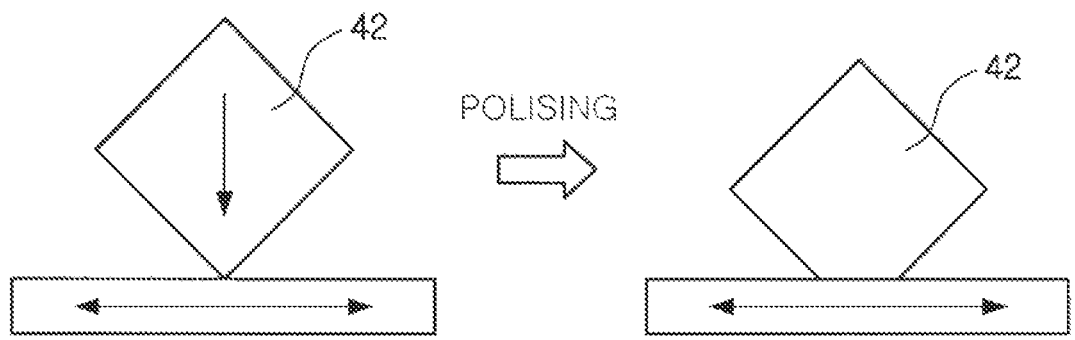
FIG. 3B is forming method of the reflector according to the first exemplary embodiment of the present invention.

FIG. 3A and FIG. 3B are views illustrating a reflector according to the first exemplary embodiment of the present invention.

As shown in FIG. 3A, the reflector 42 includes a bar-like mirror 42a having a sloped face formed in an area (namely, an upper corner portion of the side face to which light is made incident) to which light is made incident from the light source 41, and a total-reflection coated film 42b formed on the sloped face to total-reflect light made incident to the reflector 42, thus reflecting the entirety of the light made incident thereto. The bar mirror 42a may be made of a light-transmissive material, such as glass, allowing light transmission therethrough.

The reflector 42 may be formed through a process of polishing or cutting a corner of the bar mirror 42a in a quadrangular shape as shown in FIG. 3B, in consideration of a fabrication cost.

The structure of the optical transmission apparatus can be simplified by eliminating a support of the monitoring element according to second and third exemplary embodiments of the present invention.

Figure 4A:
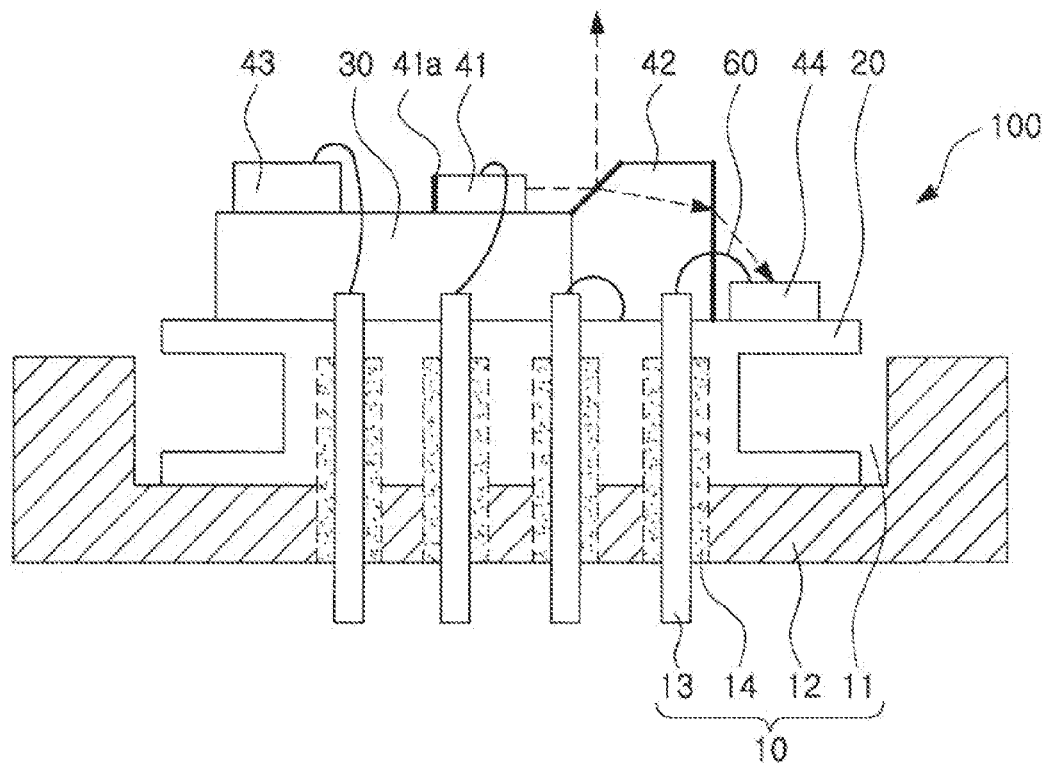
FIG. 4A is a view illustrating a light transmission apparatus according to a second exemplary embodiment of the present invention.
Figure 4B:
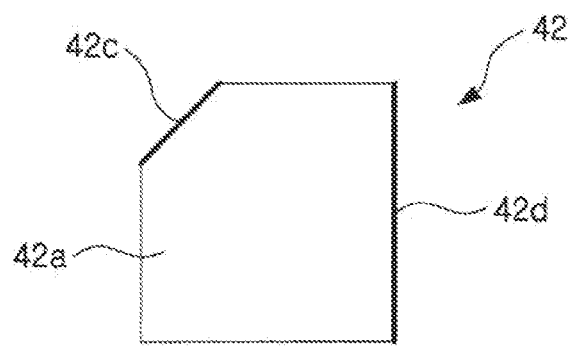
FIG. 4B is a view illustrating the reflector according to a second exemplary embodiment of the present invention.

FIG. 4A and FIG. 4B are views illustrating a light transmission apparatus according to a second exemplary embodiment of the present invention.

With reference to FIG. 4A, in the light transmission apparatus 100, the monitoring element 44 is mounted on the surface of the cooler 20 such that it is positioned in front of the light source 41 and the reflector 42, while the support 50 of the monitoring element 44 in the first exemplary embodiment of the present invention is eliminated.

To this end, as shown in FIG. 4B, the reflector 42 includes a bar-like mirror 42a having a sloped face formed in an area (namely, an upper corner portion of the side face to which light is made incident) to which light is made incident from the light source 41, a beam splitter coated film 42c formed on the sloped face to reflect a majority of light made incident thereto and allow the remaining portion of the light to be transmitted therethrough, and a non-reflection coated film 42d formed in an area from which light is output (namely, a lower corner of the side from which light is output) to allow light, which is made incident thereto, to be entirely transmitted therethrough. In this case, the sloped face of the bar mirror 42a may have a slope angle ranging from 45 degrees or 41 degrees to 49 degrees.

Also, in order to increase a monitoring efficiency of the monitoring element 44, a total-reflection coated film 41a may be additionally formed on a rear surface of the light source 41 to allow light, from the light source 41, to be entirely output to the front side of the light source 41 (namely, toward the reflector 42 and the monitoring element 44).

Accordingly, when the light source 41 generates light, a majority of the light from the light source 41 is externally reflected by the beam splitter coated film 42c and the remaining portion of the light is made incident to the monitoring element 44 through the bar mirror 42a and the non-reflection coated film 42b. The monitoring element 44 receives the portion of light to monitor a current state of the light source 41.

Accordingly, the light transmission apparatus 100 according to the second exemplary embodiment of the present invention is able to monitor the quantity of light of the light source 41 even without the support 50.

Figure 5A:
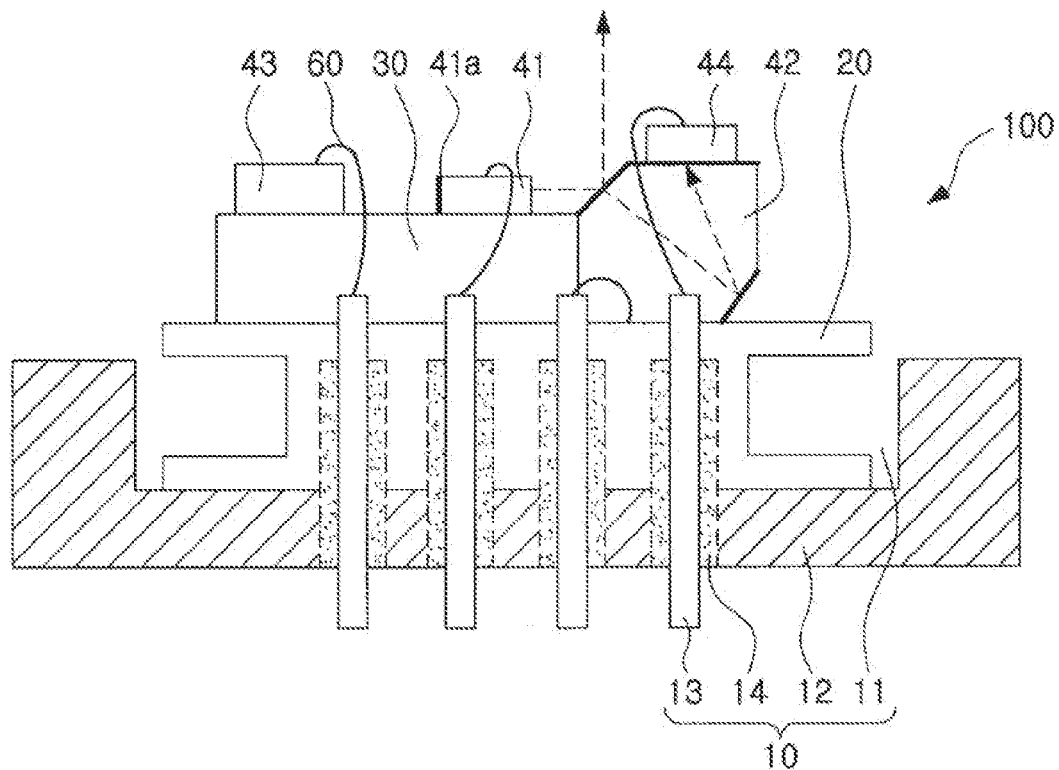
FIG. 5A is a view illustrating a light transmission apparatus according to a third exemplary embodiment of the present invention.
Figure 5B:
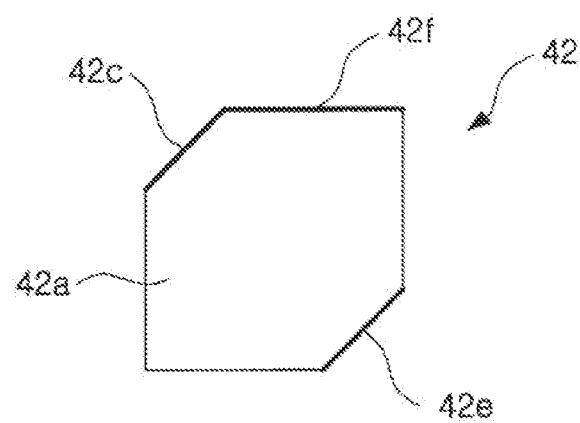
FIG. 5B is a view illustrating the reflector according to a third exemplary embodiment of the present invention.

FIG. 5A and FIG. 5B are views illustrating a light transmission apparatus according to a third exemplary embodiment of the present invention.

With reference to FIG. 5A, in the light transmission apparatus 100, the monitoring element 44 is mounted on an upper surface of the reflector 42 and the support 50 of the monitoring element 44 is eliminated.

To this end, as shown in FIG. 5B the reflector 42 includes a bar-like mirror 42a having a sloped face formed in an area (namely, an upper corner portion of the side face to which light is made incident) to which light is made incident from the light source 41, a beam splitter coated film 42c formed on the sloped face to reflect a majority of light made incident thereto and allow the remaining portion of the light to be transmitted therethrough, a total-reflection coated film 42e formed in an area from which light is output (namely, a lower corner of the side from which light is output) to allow light, which is made incident thereto, to be totally reflected, and a non-reflection coated film 42f formed in an area that reflected by the total-reflection coated film 42e reaches (namely, an upper portion of the bar mirror 42a) to allow light, which is made incident thereto, to be entirely transmitted therethrough.

Also, the total-reflection coated film 41a may be additionally formed on a rear surface of the light source 41 to allow light, from the light source 41, to be entirely output to the front side of the light source 41 (namely, toward the reflector 42 and the monitoring element 44).

Accordingly, when the light source 41 generates light, a portion of the light from the light source 41 reaches the total-reflection coated film 42e through the beam splitter coated film 42c, the bar mirror 42a, the total reflection coated film 42e, and the non-reflection coated film 42f, and is then totally reflected again by the total reflection coated film 42e so as to be transmitted to the upper surface of the bar mirror 42a. The monitoring element 44 receives light made incident thereto to monitor a current state of the light source 41.

Accordingly, the light transmission apparatus 100 according to the second exemplary embodiment of the present invention is able to monitor the quantity of light of the light source 41 even without the support 50.

In addition, the structure of the light transmission apparatus can be simplified by eliminating the reflector according to a fourth exemplary embodiment of the present invention.

Figure 6:
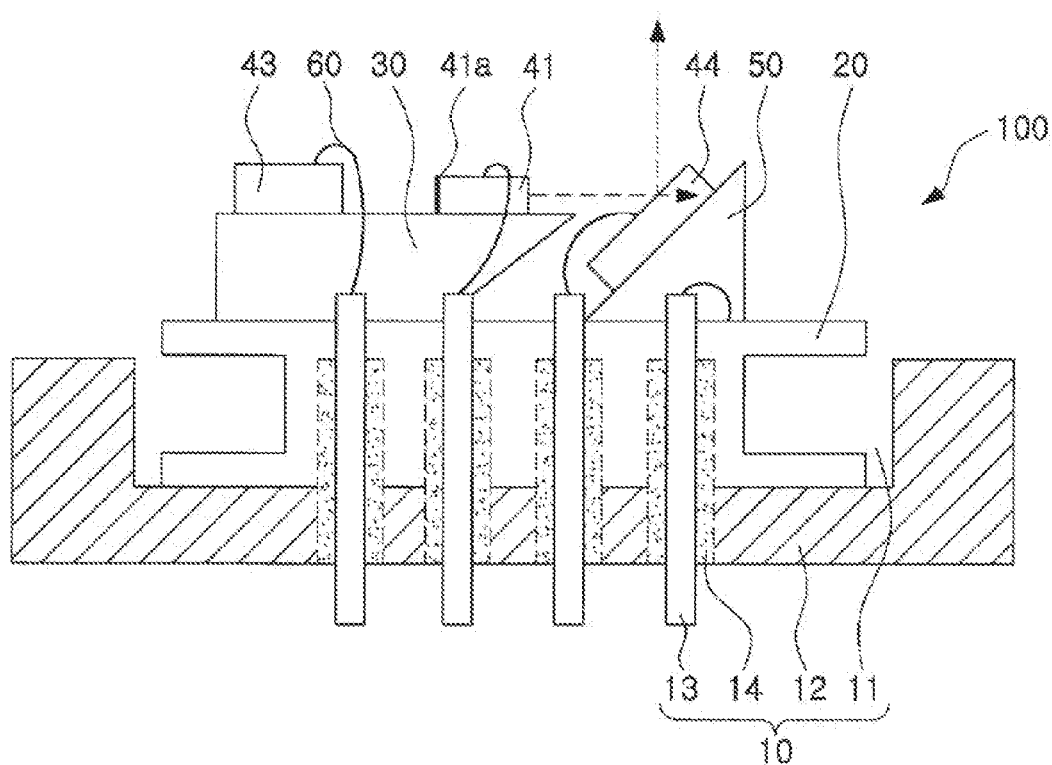
FIG. 6 is a view illustrating a light transmission apparatus according to a fourth exemplary embodiment of the present invention.

FIG. 6 is a view illustrating a light transmission apparatus according to a fourth exemplary embodiment of the present invention.

Figure 7:
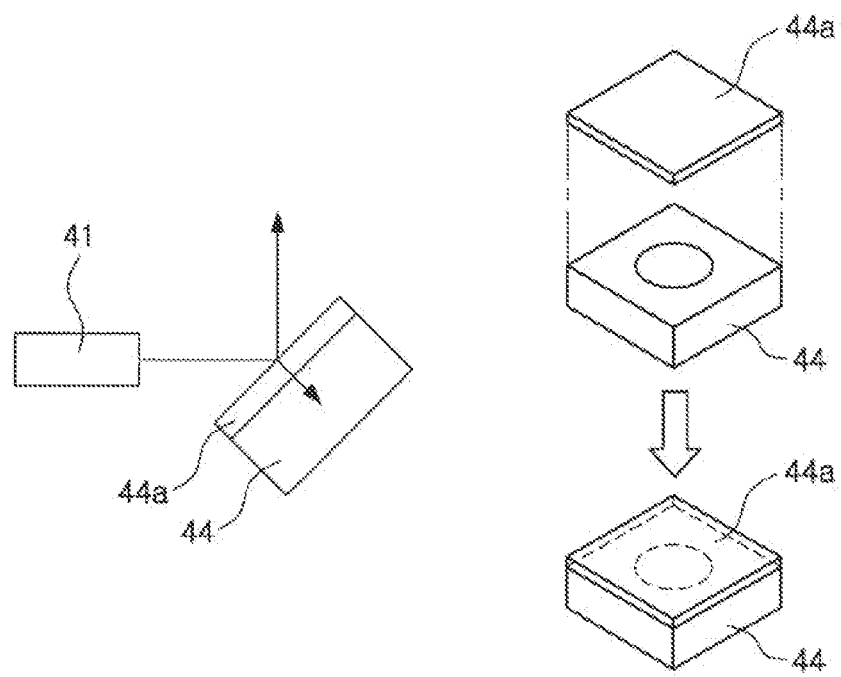
FIG. 7 is a view illustrating a monitoring element of the light emission apparatus according to the fourth exemplary embodiment of the present invention.

As shown in FIG. 6, in the light transmission apparatus, a support 50 having a sloped face is provided and mounted on the cooler 20 such that it is positioned in front of the light source 41. As shown in FIG. 7, the monitoring element 44, having a beam splitter coated film 44 formed in an area to which light from the light source 41 is made incident, is positioned on the sloped face of the support 50.

Also, the total-reflection coated film 41a may be additionally formed on a rear surface of the light source 41 to allow light, from the light source 41, to be entirely output to the front side of the light source 41 (namely, toward the reflector 42 and the monitoring element 44).

Then, light from the light source 41 is entirely made incident to the monitoring element 44. The monitoring element 44 reflects a majority of light made incident through the beam splitter coated film 44a and receives the remaining portion of the light to perform a monitoring operation.

Namely, the monitoring element 44 according to the fourth exemplary embodiment of the present invention serves as a reflector as well as the monitoring element, whereby the light transmission apparatus does not need to have an additional reflector.

As set forth above, according to exemplary embodiments of the invention, the light transmission apparatus having a temperature control function includes a package having a cavity and offsets the height of the cooler through the cavity, whereby the length of signal lines connecting the lead pins of the package or connecting from the wire bonding to the lead pins can be reduced to improve the signal transmission characteristics of the light transmission apparatus. Also, because the cooler is mounted on the surface of the package, the heat releasing characteristics of the cooler can be improved, and because light from the light source can be discharged by using the reflector mounted on the cooler, the light source can be mounted on the surface and accordingly, the temperature control characteristics can be improved.

In addition, the fabrication process of the light transmission apparatus can be simplified by eliminating the support for mounting the monitoring element thereon or the reflector for reflecting light from the light source to thus lower a fabrication cost, and a cooling load of the cooler can be reduced by the reduced number of elements and, accordingly, power consumption can be also reduced.

Moreover, because the monitoring element is positioned in front of the light source to monitor the state of the light source, a light output resistance, noise generation, and the like, caused by an external reflection can be reduced.

While the present invention has been shown and described in connection with the exemplary embodiments, it will be apparent to those skilled in the art that modifications and variations can be made without departing from the spirit and scope of the invention as defined by the appended claims.

What is claimed is:

1. An optical transmission apparatus comprising:
a base having a cavity disposed in an upper part of the base, the cavity being recessed from a top surface of the base;
a cooler configured to control a temperature of the optical transmission apparatus, the cooler mounted on a bottom surface of the cavity disposed in the upper part of the base;
a substrate mounted on the cooler;
a light source mounted on the substrate and configured to generate light,
a support mounted on the cooler;
a monitoring light reception element mounted on the support and receiving light to perform a monitoring operation; and
a reflector mounted on the cooler and totally reflecting light from the light source to an outside,
wherein the reflector comprises:
a bar mirror having a sloped face formed on an area to which light is made incident; and
a total reflection coated film formed on the sloped face, and
wherein the support and the reflector are each mounted directly on a same surface of the cooler.

2. The apparatus of claim 1, further comprising a lead pin penetrating the base.

3. The apparatus of claim 2, further comprising an insulator formed to cover the lead pin.

4. The apparatus of claim 1, further comprising: a thermistor mounted on the cooler or the substrate to measure the temperature of the optical transmission apparatus.

5. An optical transmission apparatus comprising:
a package having a cavity;
a cooler mounted in the cavity and controlling a temperature;
a substrate mounted on the cooler and including a light source mounted thereon to generate light;
a reflector mounted on the cooler such that it is positioned in front of the light source, and reflecting a majority of light from the light source to an outside and allowing a remaining portion to be transmitted therethrough, the reflector comprising:
a bar mirror having a sloped face formed on an area to which light is made incident;
a beam splitter coated film formed on the sloped face;
a total reflection coated film formed on an area from which light is output; and
a non-reflection coated film formed on an area that light, which has been reflected by the total reflection coated film, reaches; and
a monitoring light reception element mounted on the non-reflection coated film of the reflector and performing a monitoring operation upon receiving light made incident through the reflector.

6. An optical transmission apparatus comprising:
a package having a cavity;
a cooler mounted in the cavity and controlling temperature;
a substrate mounted on the cooler and including a light source mounted thereon to generate light;
a support mounted on the cooler such that it is positioned in front of the light source, and having a sloped face; and
a monitoring light reception element mounted on the sloped face of the support, and reflecting a majority of light from the light source to an outside and receiving a remaining portion of the light to perform a monitoring operation.

* * * * *